US010262751B2

(12) United States Patent
Uduebho et al.

(10) Patent No.: US 10,262,751 B2
(45) Date of Patent: Apr. 16, 2019

(54) MULTI-DIMENSIONAL OPTIMIZATION OF ELECTRICAL PARAMETERS FOR MEMORY TRAINING

(71) Applicant: Intel Corporation, Santa Clara, CA (US)

(72) Inventors: Oseghale O. Uduebho, Portland, OR (US); Adam J. Norman, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 15/280,320

(22) Filed: Sep. 29, 2016

(65) Prior Publication Data

US 2018/0088849 A1  Mar. 29, 2018

(51) Int. Cl.
G06F 9/455 (2018.01)
G06F 17/50 (2006.01)
G11C 29/02 (2006.01)

(52) U.S. Cl.
CPC .......... *G11C 29/028* (2013.01); *G11C 29/02* (2013.01)

(58) Field of Classification Search
CPC ...... G06F 3/0629; G06F 3/0673; G06F 3/061; G11C 29/028; G11C 29/02
See application file for complete search history.

(56) References Cited

U.S. PATENT DOCUMENTS

| 9,135,572 B2 * | 9/2015 | Bjork | G06N 99/005 |
| 9,665,289 B1 * | 5/2017 | Mach | G06F 3/061 |
| 2003/0154062 A1 | 8/2003 | Daft et al. | |
| 2004/0148049 A1 | 7/2004 | Schwarm | |
| 2007/0005531 A1 * | 1/2007 | George | G06N 3/08 706/16 |
| 2009/0285007 A1 * | 11/2009 | Majewski | G11C 7/20 365/148 |
| 2010/0312735 A1 * | 12/2010 | Knoblauch | G06N 3/0445 706/25 |
| 2011/0178789 A1 | 7/2011 | Miranda et al. | |
| 2012/0023318 A1 * | 1/2012 | Xing | G06F 9/4403 713/2 |
| 2013/0155788 A1 * | 6/2013 | Brandi | G11C 29/021 365/189.011 |
| 2013/0204585 A1 | 8/2013 | Basudhar | |
| 2014/0032826 A1 * | 1/2014 | Lee | G06F 12/00 711/104 |

(Continued)

OTHER PUBLICATIONS

International Search Report and Written Opinion in International Application No. PCT/US2017/049553, dated Dec. 11, 2017, 10 pages.

*Primary Examiner* — Nha T Nguyen
(74) *Attorney, Agent, or Firm* — Alliance IP, LLC

(57) ABSTRACT

Aspects of the embodiments are directed to systems, methods, and devices for generating a design of experiments (DOE) matrix, the DOE matrix comprising a set of possible combinations of values for a plurality of electrical parameters; iteratively applying each combination of values for the plurality of electrical parameters to one or more memory pins; determining a margin response for each combination of values; generating a prediction function based on a correlation of the margin response and each combination of values; and optimizing the plurality of electrical parameters based on the prediction function.

14 Claims, 6 Drawing Sheets

(56) References Cited

U.S. PATENT DOCUMENTS

| | | | |
|---|---|---|---|
| 2014/0181429 A1* | 6/2014 | Malladi | G06F 12/00 |
| | | | 711/154 |
| 2014/0317334 A1 | 10/2014 | Gadsing | |
| 2015/0154082 A1* | 6/2015 | Dasari | G06F 11/1666 |
| | | | 711/162 |
| 2015/0378603 A1* | 12/2015 | Dearth | G06F 13/4072 |
| | | | 711/154 |
| 2016/0188414 A1 | 6/2016 | Jayakumar et al. | |
| 2016/0322042 A1* | 11/2016 | Vlietinck | G06N 3/08 |
| 2017/0249551 A1* | 8/2017 | Iljazi | G06N 3/10 |
| 2017/0286330 A1* | 10/2017 | Morris | G06F 13/1668 |
| 2017/0286679 A1* | 10/2017 | Khare | G06F 21/566 |
| 2017/0323222 A1* | 11/2017 | Rao | G06N 99/005 |
| 2018/0018583 A1* | 1/2018 | Cha | G11C 7/222 |

\* cited by examiner

MULTI-DIMENSIONAL OPTIMIZATION OF ELECTRICAL PARAMETERS FOR MEMORY TRAINING

TECHNICAL FIELD

This disclosure pertains to multi-dimensional optimization of electrical parameters for memory training.

BACKGROUND

The scalability of the optimization routines for DDR memory bus can be impacted by the complexity of parameter interactions, margin saturation, an execution timing, among other things.

Memory Reference Code (MRC) performs one-dimensional sweeps or two-dimensional (fine/coarse grid) training steps, to optimize electrical parameters. The increasing number of electrical parameters to optimize for makes this computationally inefficient due to significant overhead in run count. In addition, the sequence of training steps is determined empirically using Customer Reference Boards (CRB) and Reference Validation Platforms (RVP). This assumes that customer platforms are within the Product Design Guide (PDG). As a result, potential interactions between independent training steps are not determined on the fly. Some interactions are predetermined empirically using platforms that are not entirely representative of the entire ecosystem.

Margin saturation complexity can also impact scalability. A one dimensional training step is prone to error due to margin saturation. Averaging margins can mitigate noise impact, but averaging cannot account for margin saturation.

Execution time range sweeps can require empirical data from electrical validation procedures to determine subranges. The ranges swept can be a subset of Design for Test capabilities, which can result in a constrained optimization.

BRIEF DESCRIPTION OF THE DRAWINGS

It is understood that the drawings are not drawn to scale and are for illustrative purposes. In addition, in the drawings, like reference numerals designate corresponding parts throughout the several views.

DETAILED DESCRIPTION

Figure 1:
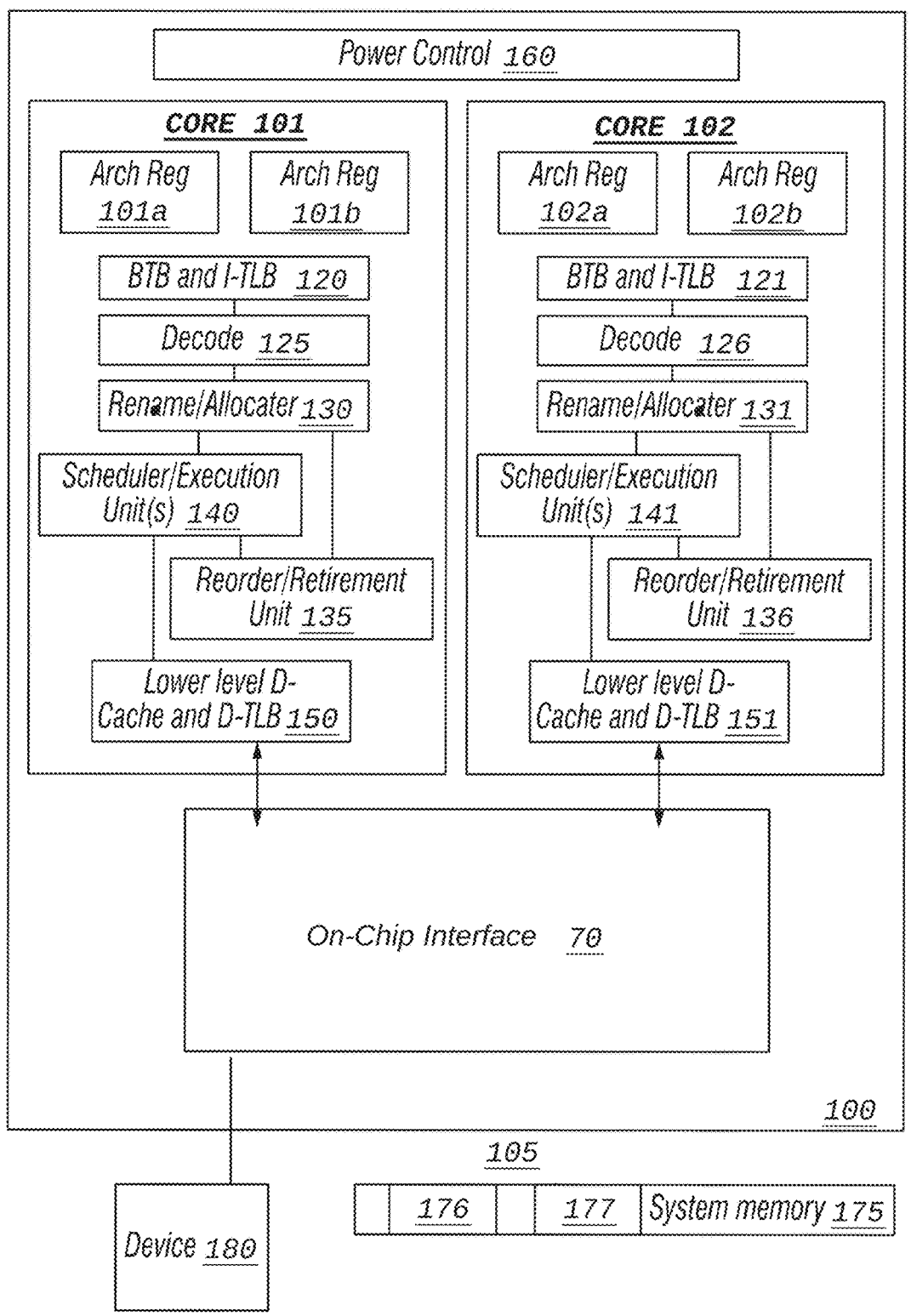
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the disclosure described herein.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

This disclosure describes iteratively training one or more electrical parameters for optimizing a memory run state. A Response Surface Method (RSM) approach is used to minimize the run counts required to estimate the optimal operating state. RSM is a curve fitting method to help determine a prediction function that minimizes the error of measurements; the prediction function can be used to estimate the output for a given input.

A reusable Design of Experiment (DOE) matrix and its inverse are available at BIOS compile time. The reusable DOE matrix can better capture interactions with an expanded search area. The systems and methods described herein can use margin response, such as a system eye area, as the response parameter. The use of the system eye area can eliminate margin saturation issues seen with one-dimensional sweeps (i.e., as opposed to relying solely on eye height or eye width). Furthermore, the eye area mitigates the impact of noise because the number of (voltage, time) coordinates that describe the boundary of the eye is not obtained in the same time slice.

The systems and methods described herein can result in fewer run counts that would be required to estimate an optimized system operating point. If N represents the number of discrete settings for each factor and k represents the number of factors, then run time complexity for traditional training (1D/2D hybrid) is of the order $N^2$. RSM run time complexity is of the order $3^k$. The order for N and k for present and future designs can make RSM faster and computationally more efficient that 1 dimensional sweeps.

The systems and methods can derive a margin prediction formula. Analytics driven on RSM data in High Volume Manufacturing (HVM) environments can provide feedback to silicon/DFT designers to enable future work.

The systems and methods provide for fewer code to maintain. The prediction function, or more in some cases, electrical parameters identified by a prediction function, can be reused on future platforms regardless of memory technology or bus frequency.

The systems and methods provide for time savings using RSM will potentially allow for increased loop count, giving way for more accurate Transaction Error Rate (TER) measurements that correspond to the tail end of the random jitter distribution.

The Design of Experiment (DOE) matrix, x, is predetermined at BIOS compile time. The training steps corresponding to matrix x generates the linear equation Ax=B, where A is a coefficient matrix and B is a response vector of system eye area. The "inverse" of x is predetermined at BIOS compile time making it a reusable least square fitting matrix thereby eliminating computational demand. A is determined at run-time which serves as the prediction function for the system margin eye area. A local maximum is determined by applying the solution space of the input against the prediction formula. To perform an additional iteration, the solution space is systematically "shrunk" such that the previously determined local maximum forms the "seed" around which a subsequent multi-dimensional search is performed.

Converging the RSM solution space per iteration ensures iterations are finite. If M denotes the maximum iterations possible, then the system is considered optimized after N iterations, where N is greater than 0 and N is less than or equal to M provided any of the following conditions are true:

the coefficient of determination ($R^2$) for the Nth iteration is less than a specified threshold; and the total sum of squares in error (SST) increases between $(n-1)^{th}$ and $N^{th}$ iteration.

Margin prediction formula determined in $(N-1)^{th}$ iteration and is used to determine the stable operating point for the system.

The DOE can represent a set of configured electrical parameters. For example, the DOE can represent 16 different combinations for electrical parameters. From the cache memory, the processor can run a point test for each of the 16 different combinations of electrical parameters. The processor can determine the margin response (e.g., eye area) for each point test.

Figure 2:
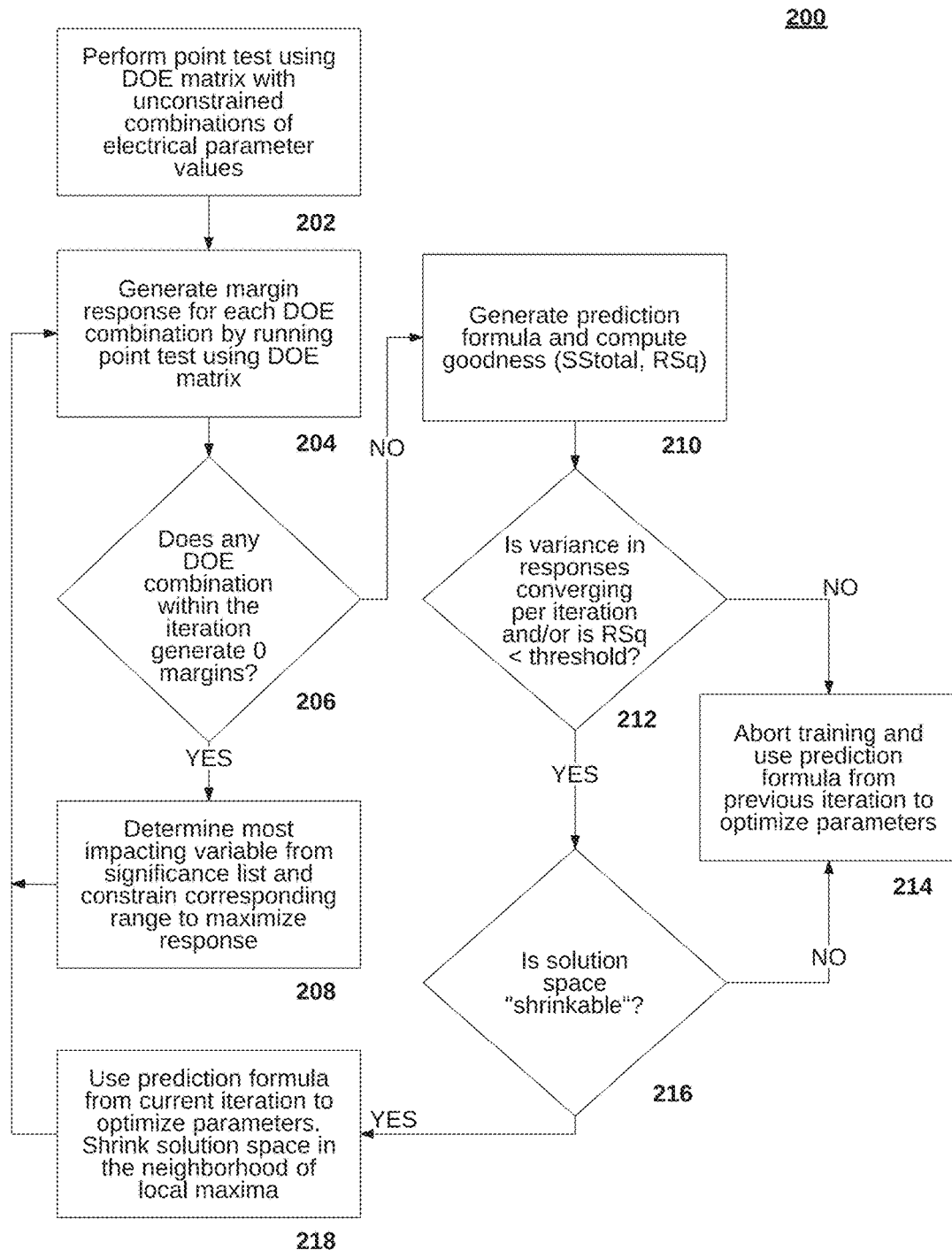
FIG. 2 is a process flow diagram for determining a prediction function based on a point test using one or more electrical parameters in accordance with embodiments of the present disclosure.

FIG. 2 is a process flow diagram 200 for determining a prediction function based on a point test using one or more electrical parameters in accordance with embodiments of the present disclosure. The process flow diagram 200 can occur prior to initialization of a computing system that includes a processor and memory. At the outset, the parameter ranges to sweep were hard coded into the processor BIOS. Given an available range for each electrical parameter value, the DOE matrix can include all parameter ranges available (202). The initial iteration can use an unconstrained set (or sample space) of electrical parameter value combinations using a broad range of possible values for each electrical parameters. The processor can run a point test using each combination of electrical parameters from the DOE matrix (202). The point test can include a test context through which transaction error rate (for memory applications) or a bit error rate for PCIe applications can be determined. The processor can generate a margin response for each of the combination of electrical parameters from the DOE matrix (204).

The processor can determining whether any of the combination of parameters results in a zero margin response (206). If there is a zero margin response, then the processor can determine a most impacting electrical parameter value from the combination of electrical parameters that resulted in the zero margin response (208). The parameter range can be constrained to values excluding the most impacting electrical parameter value that resulted in the zero margin response, or, in embodiments, the parameter range can be constrained to values that result in a maximum margin response for the combination of electrical parameters. A new margin response can be generated based on the constrained parameters (204).

If there is no zero margin response from any of the combination of electrical parameters, then a prediction formula can be generated by correlating the margin response to the corresponding combination of electrical parameters (210). For example, if the DOE matrix is represented by x, and the margin response values (such as eye area value) for each combination of electrical parameter, is represented by B, then the prediction function A can be defined by Ax=B. The processor can apply or test the prediction function to determine how well the prediction function can predict margin responses.

The processor can determine whether a variance in responses is converging per run iteration and whether RSq<threshold (212), where the threshold can be a value of 0.75 or greater. The prediction value quality can be quantified using one or more statistical characteristics, such as:

SStotal=sum of squares values total;

SSe=total sum of squares errors;

SStotal=SSM+SSe, where SS is notation for sum of squares and T, M, and E are notation for total, model, and error, respectively; and RSq=correlation coefficient.

The quality of the prediction function can be represented by a RSq correlation coefficient above 0.85, then the prediction function can be considered of sufficient quality; in embodiments, a low value for the SStotal can also be used as a quantifier for a reliable prediction function.

If the variance is not converging per run iteration (or, put different, if variance does not change between iterations) and RSq>threshold, then the training process can stop, and the prediction function from the last iteration can be used for optimizing electrical parameter values (214).

If the variance in responses is converging and/or RSq<threshold, then the processor can determine whether the solution space can be refined (216). If the solution space (e.g., the available combination of electrical parameter values) cannot be further refined, then the training process can stop, and the prediction function from the last iteration can be used to optimize electrical parameter values (214). If the solution space can be refined, the processor can use prediction formula from the current iteration to optimize parameters, and the processor can refine the solution space to values similar to values that result in a local maxima (218). The DOE matrix can be revised to includes a smaller solution space (e.g., a smaller number of combinations of electrical parameters and/or a smaller range of electrical parameter values) based on the local maxima from the previous DOE run iteration. The point test can be run using the new DOE matrix (204).

Results are stored on flash memory, and conditions are recalled on a warm reset.

In embodiments, the electrical parameters can include two or more of a DQ bus drive strength (Transmit side), a Transmit equalization, a Receive equalization, a slew rate (Transmit side), an on-die termination at CPU side (during a DQ read event), or a DIMM $R_{ON}$ i.e. Impedance at DIMM output drivers (during a DQ read event), or other electrical parameters.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 3:
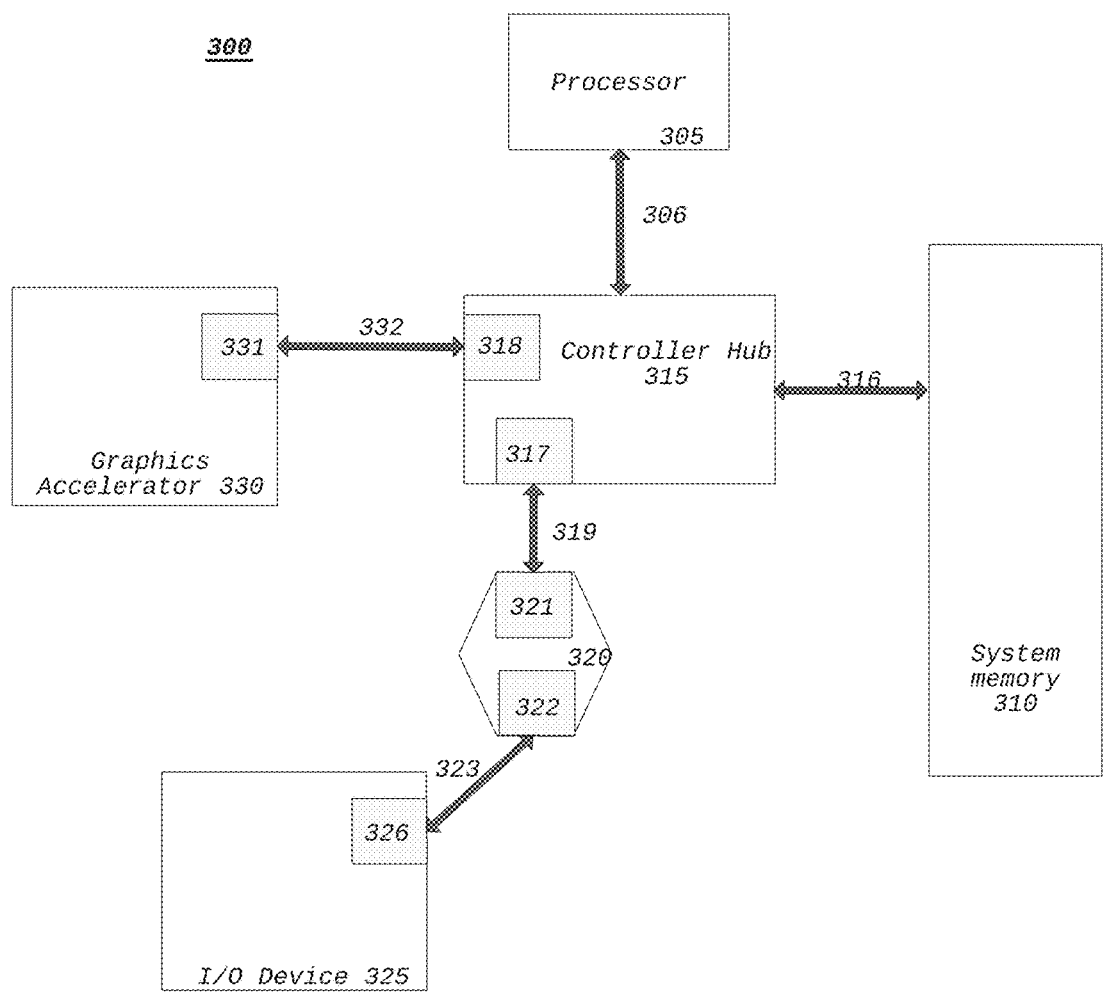
FIG. 3 illustrates an embodiment of a computing system including an interconnect architecture in accordance with embodiments of the present disclosure.

Referring to FIG. 3, an embodiment of a fabric composed of point-to-point Links that interconnect a set of components is illustrated. System 300 includes processor 305 and system memory 310 coupled to controller hub 315. Processor 305 includes any processing element, such as a microprocessor, a host processor, an embedded processor, a co-processor, or other processor. Processor 305 is coupled to controller hub 315 through front-side bus (FSB) 306. In one embodiment, FSB 306 is a serial point-to-point interconnect as described below. In another embodiment, link 306 includes a serial, differential interconnect architecture that is compliant with different interconnect standard.

System memory 310 includes any memory device, such as random access memory (RAM), non-volatile (NV) memory, or other memory accessible by devices in system 300. System memory 310 is coupled to controller hub 315 through memory interface 316. Examples of a memory interface include a double-data rate (DDR) memory interface, a dual-channel DDR memory interface, and a dynamic RAM (DRAM) memory interface.

In one embodiment, controller hub 315 is a root hub, root complex, or root controller in a Peripheral Component Interconnect Express (PCIe or PCIE) interconnection hierarchy. Examples of controller hub 315 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 305, while controller 315 is to communicate with I/O devices, in a similar manner as described below. In some embodiments, peer-to-peer routing is optionally supported through root complex 315.

Here, controller hub 315 is coupled to switch/bridge 320 through serial link 319. Input/output modules 317 and 321, which may also be referred to as interfaces/ports 317 and 321, include/implement a layered protocol stack to provide communication between controller hub 315 and switch 320. In one embodiment, multiple devices are capable of being coupled to switch 320.

Switch/bridge 320 routes packets/messages from device 325 upstream, i.e. up a hierarchy towards a root complex, to controller hub 315 and downstream, i.e. down a hierarchy away from a root controller, from processor 305 or system memory 310 to device 325. Switch 320, in one embodiment, is referred to as a logical assembly of multiple virtual PCI-to-PCI bridge devices. Device 325 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 325 may include a PCIe to PCI/PCI-X bridge to support legacy or other version PCI devices. Endpoint devices in PCIe are often classified as legacy, PCIe, or root complex integrated endpoints.

Graphics accelerator 330 is also coupled to controller hub 315 through serial link 332. In one embodiment, graphics accelerator 330 is coupled to an MCH, which is coupled to an ICH. Switch 320, and accordingly I/O device 325, is then coupled to the ICH. I/O modules 331 and 318 are also to implement a layered protocol stack to communicate between graphics accelerator 330 and controller hub 315. Similar to the MCH discussion above, a graphics controller or the graphics accelerator 330 itself may be integrated in processor 305.

Figure 4:
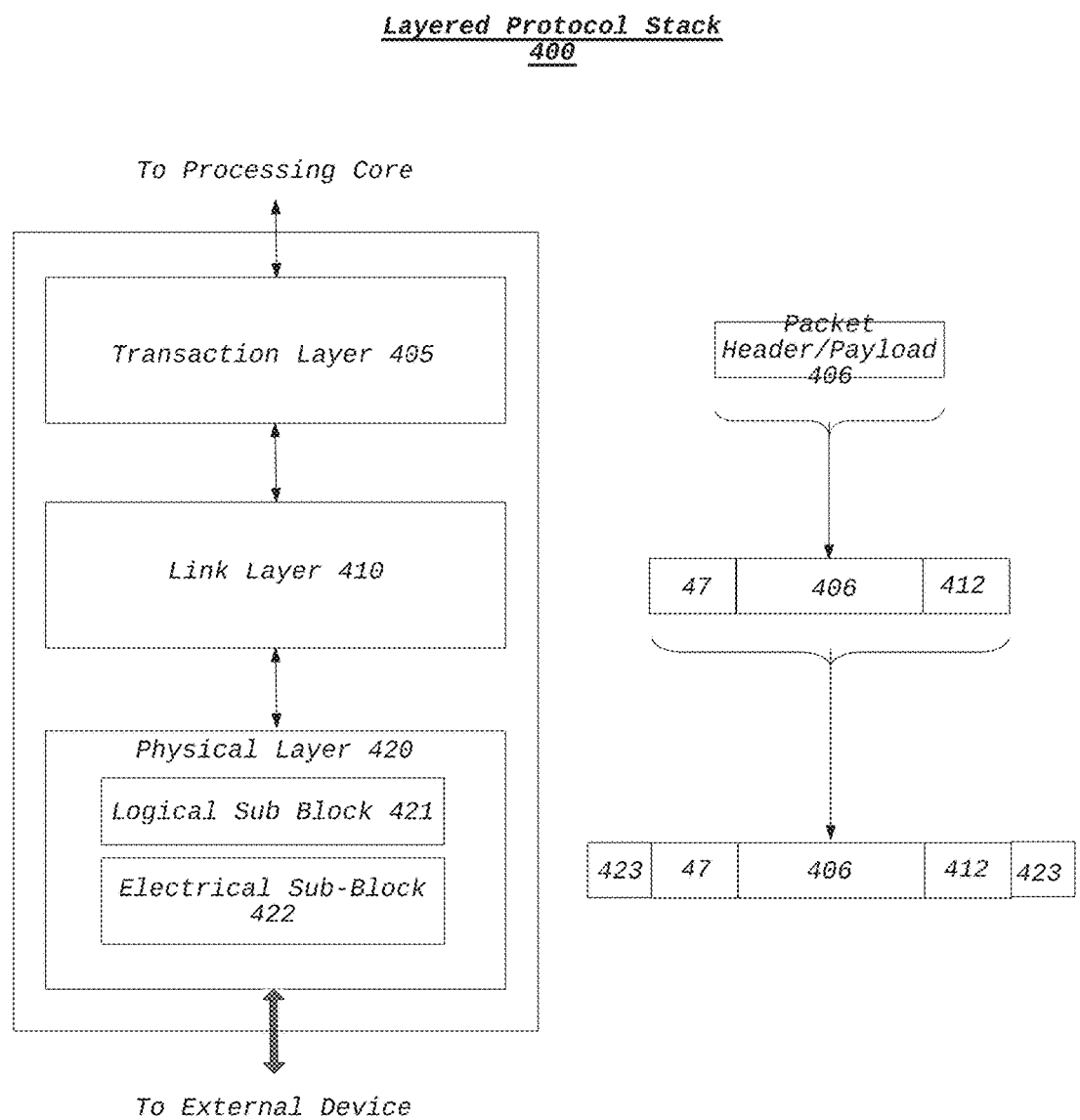
FIG. 4 illustrates an embodiment of a interconnect architecture including a layered stack in accordance with embodiments of the present disclosure.

Turning to FIG. 4 an embodiment of a layered protocol stack is illustrated. Layered protocol stack 400 includes any form of a layered communication stack, such as a Quick Path Interconnect (QPI) stack, a PCIe stack, a next generation high performance computing interconnect stack, or other layered stack. Although the discussion immediately below in reference to FIGS. 3-6 are in relation to a PCIe stack, the same concepts may be applied to other interconnect stacks. In one embodiment, protocol stack 400 is a PCIe protocol stack including transaction layer 405, link layer 410, and physical layer 420. An interface, such as interfaces 317, 318, 321, 322, 326, and 331 in FIG. 3, may be represented as communication protocol stack 400. Representation as a communication protocol stack may also be referred to as a module or interface implementing/including a protocol stack.

PCI Express uses packets to communicate information between components. Packets are formed in the Transaction Layer 405 and Data Link Layer 410 to carry the information from the transmitting component to the receiving component. As the transmitted packets flow through the other layers, they are extended with additional information necessary to handle packets at those layers. At the receiving side the reverse process occurs and packets get transformed from their Physical Layer 420 representation to the Data Link Layer 410 representation and finally (for Transaction Layer Packets) to the form that can be processed by the Transaction Layer 405 of the receiving device.

Transaction Layer

In one embodiment, transaction layer 405 is to provide an interface between a device's processing core and the interconnect architecture, such as data link layer 410 and physical layer 420. In this regard, a primary responsibility of the transaction layer 405 is the assembly and disassembly of packets (i.e., transaction layer packets, or TLPs). The translation layer 405 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 405. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 405 assembles packet header/payload 406. Format for current packet headers/payloads may be found in the PCIe specification at the PCIe specification website.

Figure 5:
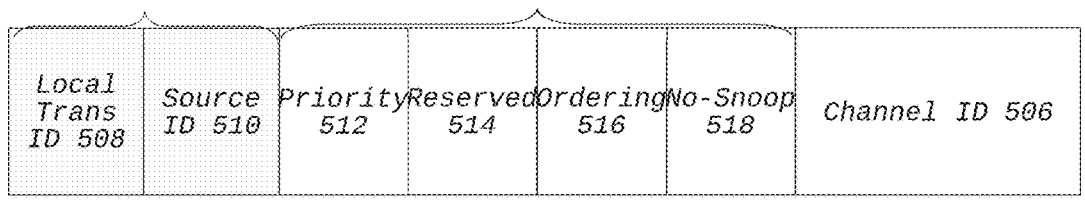
FIG. 5 illustrates an embodiment of a request or packet to be generated or received within an interconnect architecture in accordance with embodiments of the present disclosure.

Quickly referring to FIG. 5, an embodiment of a PCIe transaction descriptor is illustrated. In one embodiment, transaction descriptor 500 is a mechanism for carrying transaction information. In this regard, transaction descriptor 500 supports identification of transactions in a system. Other potential uses include tracking modifications of default transaction ordering and association of transaction with channels.

Transaction descriptor 500 includes global identifier field 502, attributes field 504 and channel identifier field 506. In the illustrated example, global identifier field 502 is depicted comprising local transaction identifier field 508 and source identifier field 510. In one embodiment, global transaction identifier 502 is unique for all outstanding requests.

According to one implementation, local transaction identifier field 508 is a field generated by a requesting agent, and it is unique for all outstanding requests that require a completion for that requesting agent. Furthermore, in this example, source identifier 510 uniquely identifies the requestor agent within a PCIe hierarchy. Accordingly, together with source ID 510, local transaction identifier 508 field provides global identification of a transaction within a hierarchy domain.

Attributes field 504 specifies characteristics and relationships of the transaction. In this regard, attributes field 504 is potentially used to provide additional information that allows modification of the default handling of transactions. In one embodiment, attributes field 504 includes priority field 512, reserved field 514, ordering field 516, and no-snoop field 518. Here, priority sub-field 512 may be modified by an initiator to assign a priority to the transaction. Reserved attribute field 514 is left reserved for future, or vendor-defined usage. Possible usage models using priority or security attributes may be implemented using the reserved attribute field.

In this example, ordering attribute field 516 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 518 is utilized to determine if transactions are snooped. As shown, channel ID Field 506 identifies a channel that a transaction is associated with.

Link Layer

Link layer 410, also referred to as data link layer 410, acts as an intermediate stage between transaction layer 405 and the physical layer 420. In one embodiment, a responsibility of the data link layer 410 is providing a reliable mechanism for exchanging Transaction Layer Packets (TLPs) between two components a link. One side of the Data Link Layer 410 accepts TLPs assembled by the Transaction Layer 405, applies packet sequence identifier 411, i.e. an identification number or packet number, calculates and applies an error detection code, i.e. CRC 412, and submits the modified TLPs to the Physical Layer 420 for transmission across a physical to an external device.

Physical Layer

In one embodiment, physical layer 420 includes logical sub block 421 and electrical sub-block 422 to physically transmit a packet to an external device. Here, logical sub-block 421 is responsible for the "digital" functions of Physical Layer 421. In this regard, the logical sub-block includes a transmit section to prepare outgoing information for transmission by physical sub-block 422, and a receiver section to identify and prepare received information before passing it to the Link Layer 410.

Physical block 422 includes a transmitter and a receiver. The transmitter is supplied by logical sub-block 421 with symbols, which the transmitter serializes and transmits onto to an external device. The receiver is supplied with serialized symbols from an external device and transforms the received signals into a bit-stream. The bit-stream is de-serialized and supplied to logical sub-block 421. In one embodiment, an 8b/10b transmission code is employed, where ten-bit symbols are transmitted/received. Here, special symbols are used to frame a packet with frames 423. In addition, in one example, the receiver also provides a symbol clock recovered from the incoming serial stream.

As stated above, although transaction layer 405, link layer 410, and physical layer 420 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 6:
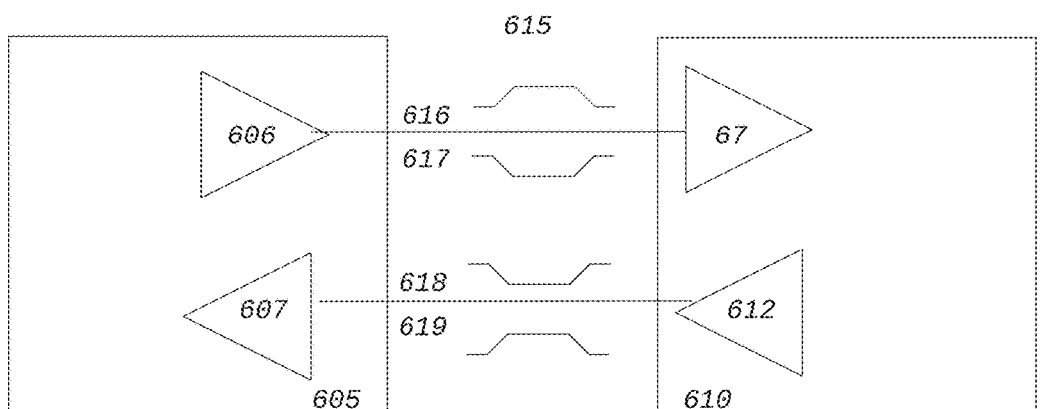
FIG. 6 illustrates an embodiment of a transmitter and receiver pair for an interconnect architecture in accordance with embodiments of the present disclosure.

Referring next to FIG. 6, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 606/611 and a receive pair 612/607. Accordingly, device 605 includes transmission logic 606 to transmit data to device 610 and receiving logic 607 to receive data from device 610. In other words, two transmitting paths, i.e. paths 616 and 617, and two receiving paths, i.e. paths 618 and 619, are included in a PCIe link.

A transmission path refers to any path for transmitting data, such as a transmission line, a copper line, an optical line, a wireless communication channel, an infrared communication link, or other communication path. A connection between two devices, such as device 605 and device 610, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 616 and 617, to transmit differential signals. As an example, when line 616 toggles from a low voltage level to a high voltage level, i.e. a rising edge, line 617 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Note that the apparatus', methods', and systems described above may be implemented in any electronic device or system as aforementioned. As specific illustrations, the figures below provide exemplary systems for utilizing the disclosure as described herein. As the systems below are described in more detail, a number of different interconnects are disclosed, described, and revisited from the discussion above. And as is readily apparent, the advances described above may be applied to any of those interconnects, fabrics, or architectures.

Figure 7:
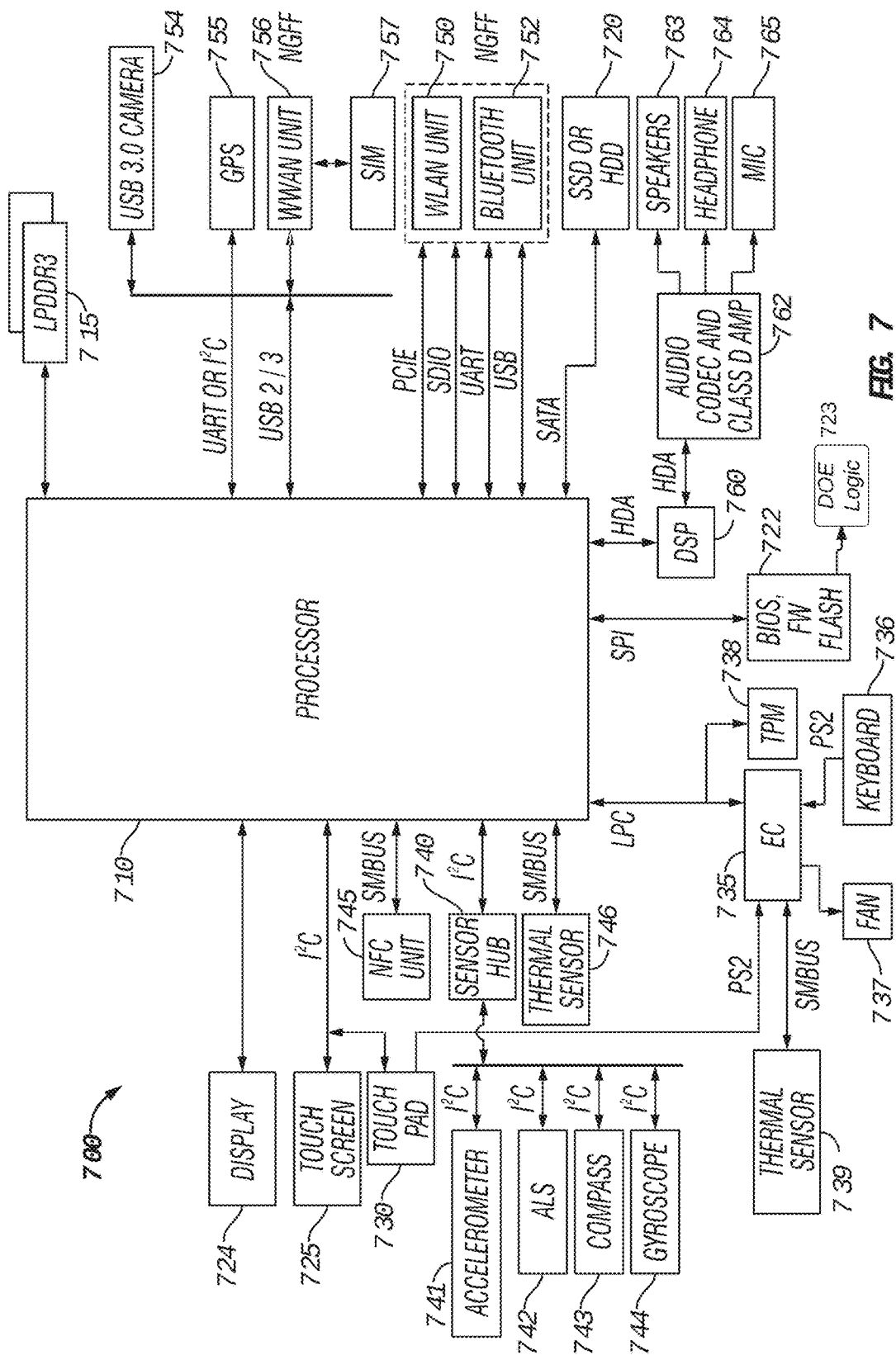
FIG. 7 illustrates another embodiment of a block diagram for a computing system in accordance with embodiments of the present disclosure.

Referring now to FIG. 7, a block diagram of components present in a computer system in accordance with an embodiment of the present disclosure is illustrated. As shown in FIG. 7, system 7 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 7 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 7, a processor 710, in one embodiment, includes a microprocessor, multi-core processor, multi-threaded processor, an ultra low voltage processor, an embedded processor, or other known processing element. In the illustrated implementation, processor 710 acts as a main processing unit and central hub for communication with many of the various components of the system 700. As one example, processor 700 is implemented as a system on a chip (SoC). As a specific illustrative example, processor 710 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor 710 in one implementation will be discussed further below to provide an illustrative example.

Processor 710, in one embodiment, communicates with a system memory 715. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (9P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 720 may also couple to processor 710. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 7, a flash device 722 may be coupled to processor 710, e.g., via a serial peripheral interface (SPI). This flash device may provide for non-volatile storage of system software, including a basic input/output software (BIOS) as well as other firmware of the system.

On initialization, the system can run a response surface method to optimize operational parameters for the memory bus. The BIOS can include an identification of one or more electrical parameters, such as DQ bus drive strength, transmit equalization value, a receive equalization value, a slew rate, an on-die termination, a DIMM impedance value, or other electrical parameters for operation of memory elements, such as non-volatile memory elements or volatile memory elements. DOE logic 723 can use an unconstrained set of electrical parameter value combinations to create a design of experiments (DOE) matrix for testing electrical parameter combinations. On initialization, the processor 710 can create a design of experiments (DOE) matrix that includes an unrestricted set of combinations of electrical parameter value combinations. The processor 710 can perform a point test on the memory to determine an optimal operating state for the memory bus using the DOE matrix. The DOE matrix can be refined for combinations of electrical parameter values that result in zero margin. A prediction formula can be determined by correlating a combination of electrical parameter values to a resulting margin response (e.g., system eye area). The DOE matrix can be iteratively refined until an optimized set of electrical parameter combinations is determined. The optimized set of electrical parameters values can be stored in BIOS for use in system deployment.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 700. Specifically shown in the embodiment of FIG. 7 is a display 724 which may be a high definition LCD or LED panel configured within a lid portion of the chassis. This display panel may also provide for a touch screen 725, e.g., adapted externally over the display panel such that via a user's interaction with this touch screen, user inputs can be provided to the system to enable desired operations, e.g., with regard to the display of information, accessing of information and so forth. In one embodiment, display 724 may be coupled to processor 710 via a display interconnect that can be implemented as a high performance graphics interconnect. Touch screen 725 may be coupled to processor 710 via another interconnect, which in an embodiment can be an I2C interconnect. As further shown in FIG. 7, in addition to touch screen 725, user input by way of touch can also occur via a touch pad 730 which may be configured within the chassis and may also be coupled to the same I2C interconnect as touch screen 725.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 710 in different manners. Certain inertial and environmental sensors may couple to processor 710 through a sensor hub 740, e.g., via an I2C interconnect. In the embodiment shown in FIG. 7, these sensors may include an accelerometer 741, an ambient light sensor (ALS) 742, a compass 743 and a gyroscope 744. Other environmental sensors may include one or more thermal sensors 746 which in some embodiments couple to processor 710 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 7, various peripheral devices may couple to processor 710 via a low pin count (LPC) interconnect. In the embodiment shown, various components can be coupled through an embedded controller 735. Such components can include a keyboard 736 (e.g., coupled via a PS2 interface), a fan 737, and a thermal sensor 739. In some embodiments, touch pad 730 may also couple to EC 735 via a PS2 interface. In addition, a security processor such as a trusted platform module (TPM) 738 in accordance with the Trusted Computing Group (TCG) TPM Specification Version 1.2, dated Oct. 2, 2003, may also couple to processor 710 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 700 can communicate with external devices in a variety of manners, including wirelessly. In the embodiment shown in FIG. 7, various wireless modules, each of which can correspond to a radio configured for a particular wireless communication protocol, are present. One manner for wireless communication in a short range such as a near field may be via a near field communication (NFC) unit 745 which may communicate, in one embodiment with processor 710 via an SMBus. Note that via this NFC unit 745, devices in close proximity to each other can communicate. For example, a user can enable system 700 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 7, additional wireless units can include other short range wireless engines including a WLAN unit 750 and a Bluetooth unit 752. Using WLAN unit 750, Wi-Fi™ communications in accordance with a given Institute of Electrical and Electronics Engineers (IEEE) 802.11 standard can be realized, while via Bluetooth unit 752, short range communications via a Bluetooth protocol can occur. These units may communicate with processor 710 via, e.g., a USB link or a universal asynchronous receiver transmitter (UART) link. Or these units may couple to processor 710 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 756 which in turn may couple to a subscriber identity module (SIM) 757. In addition, to enable receipt and use of location information, a GPS module 755 may also be present. Note that in the embodiment shown in FIG. 7, WWAN unit 756 and an integrated capture device such as a camera module 754 may communicate via a given USB protocol such as a USB 2.0 or 3.0 link, or a UART or I2C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 760, which may couple to processor 710 via a high definition audio (HDA) link. Similarly, DSP 760 may communicate with an integrated coder/decoder (CODEC) and amplifier 762 that in turn may couple to output speakers 763 which may be implemented within the chassis. Similarly, amplifier and CODEC 762 can be coupled to receive audio inputs from a microphone 765 which in an embodiment can be implemented via dual array microphones (such as a digital microphone array) to provide for high quality audio inputs to enable voice-activated control of various operations within the system. Note also that audio outputs can be provided from amplifier/CODEC 762 to a headphone jack 764. Although shown with these particular components in the embodiment of FIG. 7, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 710 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 735. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 735 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 7, understand the scope of the present disclosure is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44Whr for Win8 CS using an HDD with a RST cache configuration.

A particular implementation may provide support for 15W nominal CPU thermal design power (TDP), with a configurable CPU TDP of up to approximately 25W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 is a method that includes generating a design of experiments (DOE) matrix, the DOE matrix comprising a set of possible combinations of values for a plurality of electrical parameters; iteratively applying each combination of values for the plurality of electrical parameters to one or more memory pins; determining a margin response for each combination of values; generating a prediction function based on a correlation of the margin response and each combination of values; and optimizing the plurality of electrical parameters based on the prediction function.

Example 2 may include the subject matter of example 1, and also include determining the margin response for each combination of values; determining that at least one combination of values results in a margin response that has a zero margin; determining a most significant contributing electrical parameter value for a contributing electrical parameter that results in the zero margin; constraining values for the contributing electrical parameter to excludes the most significant contributing electrical parameter value; and applying a combination of values for the plurality of electrical parameters that excludes the most significant contributing electrical parameter value contributing to the zero margin.

Example 3 may include the subject matter of any of examples 1-2, and may also include determining that a variance in margin responses is converging; determining that the set of possible combinations of values can be reduced; applying the prediction formula to optimize the electrical parameters; identifying a subset of combinations of electrical parameters; iteratively applying the subset of combinations of electrical parameters; and determining a margin response for each of the subset of combinations of electrical parameters.

Example 4 may include the subject matter of example 1, wherein the plurality of electrical parameters comprises two or more of a DQ bus drive strength, at transmit equalization value, a receive equalization value, a slew rate, an on-die termination, or a DIMM impedance value.

Example 5 may include the subject matter of any of examples 1-4, and also can include computing an optimization value for a set of combinations of the plurality of electrical parameters.

Example 6 may include the subject matter of any of examples 1-5, and can also include refining the set of possible combinations of values for a plurality of electrical parameters to a subset of possible combinations of values for the plurality of electrical parameters based on a local maxima.

Example 7 is at least one machine accessible storage medium having code stored thereon, the code when executed on a machine, causes the machine to generate a design of experiments (DOE) matrix, the DOE matrix comprising a set of possible combinations of values for a plurality of electrical parameters; iteratively apply each combination of values for the plurality of electrical parameters to one or more memory pins; determine a margin response for each combination of values; generate a prediction function based on a correlation of the margin response and each combination of values; and optimize the plurality of electrical parameters based on the prediction function.

Example 8 may include the subject matter of example 7, the code further causing the machine to determine the margin response for each combination of values; determine that at least one combination of values results in a margin response that has a zero margin; determine a most significant contributing electrical parameter value for a contributing electrical parameter that results in the zero margin; constrain values for the contributing electrical parameter to excludes the most significant contributing electrical parameter value; and apply a combination of values for the plurality of electrical parameters that excludes the most significant contributing electrical parameter value contributing to the zero margin.

Example 9 may include the subject matter of any of examples 7-8, the code further causing the machine to determine that a variance in margin responses is converging; determine that the set of possible combinations of values can be reduced; apply the prediction formula to optimize the electrical parameters; identify a subset of combinations of electrical parameters; iteratively apply the subset of combinations of electrical parameters; and determine a margin response for each of the subset of combinations of electrical parameters.

Example 10 may include the subject matter of any of examples 7-9, wherein the plurality of electrical parameters comprises two or more of a DQ bus drive strength, at transmit equalization value, a receive equalization value, a slew rate, an on-die termination, or a DIMM impedance value.

Example 11 may include the subject matter of any of examples 7-10, the code further causing the machine to compute an optimization value for a set of combinations of the plurality of electrical parameters.

Example 12 may include the subject matter of any of examples 7-11, the code further causing the machine to refine the set of possible combinations of values for a plurality of electrical parameters to a subset of possible combinations of values for the plurality of electrical parameters based on a local maxima.

Example 13 is an apparatus in communication with a cache memory over a link, the apparatus including means for generating a design of experiments (DOE) matrix, the DOE matrix comprising a set of possible combinations of values for a plurality of electrical parameters; means for iteratively applying each combination of values for the plurality of electrical parameters to one or more memory pins; means for determining a margin response for each combination of values; means for generating a prediction function based on a correlation of the margin response and each combination of values; and means for optimizing the plurality of electrical parameters based on the prediction function.

Example 14 may include the subject matter of example 13, and can also include means for determining the margin response for each combination of values; means for determining that at least one combination of values results in a margin response that has a zero margin; means for determining a most significant contributing electrical parameter value for a contributing electrical parameter that results in the zero margin; means for constraining values for the contributing electrical parameter to excludes the most significant contributing electrical parameter value; and means for applying a combination of values for the plurality of electrical parameters that excludes the most significant contributing electrical parameter value contributing to the zero margin.

Example 15 may include the subject matter of any of examples 13-14, and also may include means for determining that a variance in margin responses is converging; means for determining that the set of possible combinations of values can be reduced; means for applying the prediction formula to optimize the electrical parameters; means for identifying a subset of combinations of electrical parameters; means for iteratively applying the subset of combinations of electrical parameters; and means for determining a margin response for each of the subset of combinations of electrical parameters.

Example 16 may include the subject matter of any of examples 13-15, wherein the plurality of electrical parameters comprises two or more of a DQ bus drive strength, at transmit equalization value, a receive equalization value, a slew rate, an on-die termination, or a DIMM impedance value.

Example 17 may include the subject matter of any of examples 13-16, and can also include means for computing an optimization value for a set of combinations of the plurality of electrical parameters.

Example 18 may include the subject matter of any of examples 13-17, and may also include means for refining the set of possible combinations of values for a plurality of electrical parameters to a subset of possible combinations of values for the plurality of electrical parameters based on a local maxima.

Example 19 is a system that includes a data link comprising a plurality of lanes; a cache memory storing electrical parameter information and algorithms for determining and applying a prediction function; and a hardware processor to generate a design of experiments (DOE) matrix, the DOE matrix comprising a set of possible combinations of values for a plurality of electrical parameters; iteratively apply each combination of values for the plurality of electrical parameters to one or more memory pins; determine a margin response for each combination of values; generate a prediction function based on a correlation of the margin response and each combination of values; and optimize the plurality of electrical parameters based on the prediction function.

Example 20 may include the subject matter of example 19, the hardware processor to determine the margin response for each combination of values; determine that at least one combination of values results in a margin response that has a zero margin; determine a most significant contributing electrical parameter value for a contributing electrical parameter that results in the zero margin; constrain values for the contributing electrical parameter to excludes the most significant contributing electrical parameter value; and apply a combination of values for the plurality of electrical parameters that excludes the most significant contributing electrical parameter value contributing to the zero margin.

Example 21 may include the subject matter of any of examples 19-20, hardware processor to determine that a variance in margin responses is converging; determine that the set of possible combinations of values can be reduced; apply the prediction formula to optimize the electrical parameters; identify a subset of combinations of electrical parameters; iteratively apply the subset of combinations of electrical parameters; and determine a margin response for each of the subset of combinations of electrical parameters.

Example 22 may include the subject matter of any of examples 19-21, wherein the plurality of electrical parameters comprises two or more of a DQ bus drive strength, at transmit equalization value, a receive equalization value, a slew rate, an on-die termination, or a DIMM impedance value.

Example 23 may include the subject matter of any of examples 19-22, hardware processor to compute an optimization value for a set of combinations of the plurality of electrical parameters.

Example 24 may include the subject matter of any of examples 19-23, hardware processor to refine the set of possible combinations of values for a plurality of electrical parameters to a subset of possible combinations of values for the plurality of electrical parameters based on a local maxima.

Example 25 may include the subject matter of example 19, and can also include a design of experiments logic to generate a design of experiments matrix based on an unconstrained set of electrical parameter value combinations.

Example 26 may include the subject matter of example 25, wherein the design of experiments logic is configured to refine the set of electrical parameter value combinations based on a zero margin point test response.

Example 27 may include the subject matter of example 25, wherein the design of experiments logic is configured to refine the set of electrical parameter value combinations based on a local maxima of margin response measurements.

What is claimed is:

1. A method comprising:
    generating a design of experiments (DOE) matrix, the DOE matrix comprising a set of possible combinations of values for a plurality of electrical parameters;
    iteratively applying each combination of values for the plurality of electrical parameters to one or more hardware memory pins across an interface compliant with a Peripheral Component Interconnect Express (PCIe) based link;
    determining a margin response for each combination of values;
    generating a prediction function based on a correlation of the margin response and each combination of values;
    optimizing the plurality of electrical parameters based on the prediction function;
    the method further comprising:
        determining whether at least one combination of values results in a margin response that has a zero margin;
        if at least one combination of values results in a margin response that has a zero margin:
            determining a most significant contributing electrical parameter value for a contributing electrical parameter that results in the zero margin;
            constraining values for the contributing electrical parameter to exclude the most significant contributing electrical parameter value; and
            applying a combination of values for the plurality of electrical parameters that excludes the most significant contributing electrical parameter value contributing to the zero margin; and
        if at least one combination of values does not result in a margin response that has a zero margin:
            determining that a variance in margin responses is converging;
            determining that the set of possible combinations of values can be reduced;
            applying the prediction formula to optimize the electrical parameters;
            identifying a subset of combinations of electrical parameters;
            iteratively applying the subset of combinations of electrical parameters; and
            determining a margin response for each of the subset of combinations of electrical parameters.

2. The method of claim 1, wherein the plurality of electrical parameters comprises two or more of a DQ bus drive strength, at transmit equalization value, a receive equalization value, a slew rate, an on-die termination, or a DIMM impedance value.

3. The method of claim 1, refining the set of possible combinations of values for a plurality of electrical parameters to a subset of possible combinations of values for the plurality of electrical parameters based on a local maxima.

4. The method of claim 1, further comprising:
    computing an optimization value for a set of combinations of the plurality of electrical parameters.

5. At least one machine accessible storage medium having code stored thereon, the code when executed on a machine, causes the machine to:
    generate a design of experiments (DOE) matrix comprising a set of combinations of values for a plurality of electrical parameters;
    apply each combination of values for the plurality of electrical parameters to one or more hardware memory pins across an interface compliant with a Peripheral Component Interconnect Express (PCIe) based link;
    determine an electrical response for each combination of values;
    generate a prediction function based on an inverse correlation between the combination of electrical parameter values and the resulting electrical response for each combination;
    optimize the plurality of electrical parameters based on the prediction function;
    determine whether at least one combination of values results in an electrical response that has a zero margin response;
    if at least one combination of values results in a margin response that has a zero margin:
    determine an electrical parameter value from the combination of values that causes the zero margin response; and
    remove the combination of electrical parameters that includes a parameter value that results in a zero margin response;
    if at least one combination of values does not result in a margin response that has a zero margin:
    determine, from a first iteration to a second iteration, a change in the margin response;
    determine that the set of possible combinations of values can be reduced;
    apply the prediction formula to optimize the electrical parameters;
    identify a subset of combinations of electrical parameters from the optimized electrical parameters;
    iteratively apply the subset of combinations of electrical parameters; and
    determine a margin response for each of the subset of combinations of electrical parameters.

6. The at least one machine accessible storage medium of claim 5, the code further causing the machine to:
    determine that a change in the margin response is not present in a current iteration when compared to a previous iteration;

determine that the set of possible combinations of values cannot be reduced; and determining a prediction formula based, at least in part, on the margin response of the current iteration.

7. The at least one machine accessible storage medium of claim 5, wherein the plurality of electrical parameters comprises two or more of a DQ bus drive strength, at transmit equalization value, a receive equalization value, a slew rate, an on-die termination, or a DIMM impedance value.

8. The at least one machine accessible storage medium of claim 5, wherein the electrical response comprises an eye area response measurement.

9. A system comprising:
a data link comprising a plurality of lanes;
a cache memory storing electrical parameter information and algorithms for determining and applying a prediction function; and
a hardware processor to:
   generate a design of experiments (DOE) matrix, the DOE matrix comprising a set of possible combinations of values for a plurality of electrical parameters;
   iteratively apply each combination of values for the plurality of electrical parameters to one or more hardware memory pins across an interface compliant with a Peripheral Component Interconnect Express (PCIe) based link;
   determine a margin response for each combination of values;
   generate a prediction function based on a correlation of the margin response and each combination of values; and
   optimize the plurality of electrical parameters based on the prediction function; hardware processor to:
   determine whether at least one combination of values results in a margin response that has a zero margin;
   if at least one combination of values results in a margin response that has a zero margin:
      determine a most significant contributing electrical parameter value for a contributing electrical parameter that results in the zero margin;
      constrain values for the contributing electrical parameter to exclude the most significant contributing electrical parameter value; and
      apply a combination of values for the plurality of electrical parameters that excludes the most significant contributing electrical parameter value contributing to the zero margin;
   if at least one combination of values does not result in a margin response that has a zero margin:
      determine that a variance in margin responses is converging;
      determine that the set of possible combinations of values can be reduced;
      apply the prediction formula to optimize the electrical parameters;
      identify a subset of combinations of electrical parameters;
      iteratively apply the subset of combinations of electrical parameters; and
      determine a margin response for each of the subset of combinations of electrical parameters.

10. The system of claim 9, wherein the plurality of electrical parameters comprises two or more of a DQ bus drive strength, at transmit equalization value, a receive equalization value, a slew rate, an on-die termination, or a DIMM impedance value.

11. The system of claim 9, wherein the hardware processor is configured to:
refine the set of possible combinations of values for a plurality of electrical parameters to a subset of possible combinations of values for the plurality of electrical parameters based on a local maxima.

12. The system of claim 9, further comprising a design of experiments logic to generate a design of experiments matrix based on an unconstrained set of electrical parameter value combinations.

13. The system of claim 12, wherein the design of experiments logic is configured to refine the set of electrical parameter value combinations based on a zero margin point test response.

14. The system of claim 12, wherein the design of experiments logic is configured to refine the set of electrical parameter value combinations based on a local maxima of margin response measurements.

* * * * *